(12) United States Patent
Wen

(10) Patent No.: US 6,624,028 B1
(45) Date of Patent: Sep. 23, 2003

(54) METHOD OF FABRICATING POLY SPACER GATE STRUCTURE

(75) Inventor: Wen-Ying Wen, Hsinchu (TW)

(73) Assignee: Megawin Technology Co., Ltd., Hsinchu (TW)

(*) Notice: Subject to any disclaimer, the term of this patent is extended or adjusted under 35 U.S.C. 154(b) by 0 days.

(21) Appl. No.: 10/086,418

(22) Filed: Mar. 4, 2002

(51) Int. Cl.⁷ .................. H01L 21/336; H01L 21/28
(52) U.S. Cl. .................. 438/267; 438/593; 438/596
(58) Field of Search .................. 438/257–267, 438/593, 596; 257/314–326

(56) References Cited

U.S. PATENT DOCUMENTS 6,312,989 B1 * 11/2001 Hsieh et al. .................. 438/257
6,358,827 B1 * 3/2002 Chen et al. .................. 438/585
6,518,110 B2 * 2/2003 Wen .................. 438/201

* cited by examiner

Primary Examiner—Wael Fahmy
Assistant Examiner—Marcos D. Pizarro-Crespo
(74) Attorney, Agent, or Firm—Rosenberg, Klein & Lee

(57) ABSTRACT

The present invention provides a fabrication method of devices like flash memory cells, which is used to fabricate a poly spacer as a floating gate. In the present invention, an oxide, a predefined and patterned first dielectric, a first poly silicon, and a second dielectric are formed in order on the surface of a semiconductor substrate. Next, anisotropic etch is performed to the second dielectric to form dielectric spacer around projective sides of the first poly silicon. The first poly silicon is then etched with the dielectric spacer as a mask. Subsequently, the first dielectric is removed. A poly spacer is thus completed. The poly spacer is used as a floating gate to complete a flash memory. A channel length of stability and easy control and tips useful for point discharge can thus be obtained so that repetitive control of fabrication of semiconductor devices can be achieved.

19 Claims, 4 Drawing Sheets

METHOD OF FABRICATING POLY SPACER GATE STRUCTURE

FIELD OF THE INVENTION

The present invention relates to a fabrication method of flash memory device and, more particularly, to a fabrication method of devices like flash memory cells, which is used to fabricate a poly spacer and use the poly spacer as a floating gate.

BACKGROUND OF THE INVENTION

Flash memories are nonvolatile memories utilizing floating gate transistors as the basis. A flash memory arranges memory cells in arrays in a way suitable to its own operation. The memory cell is generally used to store a single bit of data.

In a conventional fabrication process of flash memory, a spacer structure is first fabricated on a semiconductor substrate. The spacer structure is then used to define the channel length. However, in this method, control of profile of the spacer is difficult, and the implanted positions of source and drain cannot be accurately controlled. Therefore, it is difficult to control the channel length.

Besides, in the present flash memory techniques, the spacer can be used as the floating gate. For instance, U.S. Pat. No. 5,427,968 disclosed a method for fabricating a split-gate flash memory cell with separated and self-aligned tunneling regions. Referring to FIG. 1, a semiconductor substrate 30 is provided with a gate oxide 32 and a silicon nitride 34 formed on the surface thereof, as shown in FIG. 1(a). The silicon nitride 34 is etched out by means of photolithography, and the exposed gate oxide 32 is removed. A tunnel oxide 36 and a floating gate 38 are formed in order on the substrate 30. A floating gate 38 of annular poly spacer structure is formed to enclose the silicon nitride 34 by means of anisotropic etch, as shown in FIG. 1(b). A source 40 and a drain 42 are formed in the semiconductor substrate 30 by means of ion implantation. The silicon nitride 34 is then removed. Next, an insulating dielectric 44 as shown in FIG. 1(c) is formed on the floating gate 38 and the surface of the exposed substrate 30. Subsequently, a poly silicon is deposited on the surface of the insulating dielectric 44. The poly silicon is then etched to form a control gate 46, as shown in FIG. 1(d). A flash memory cell structure is thus formed.

However, in the above method, it is difficult to control the profile and length of the spacer because of slight difference of fabrication parameters and devices when the spacer is fabricated so that it is difficult to control the channel length of memory. Moreover, the channel lengths of flash memories fabricated at different times are inconsistent so that repetitive control cannot be achieved.

Additionally, the operation of the flash memory depends on the technique of injecting or removing charges of the floating gate. When erasing data, this kind of floating gate of poly spacer needs tips to perform point discharge so that charges can be removed by means of the Fowler-Nordheim tunneling effect. In this U.S. patent, the fabricated floating gate of poly spacer has no good tip structure so that the effect of point discharge is limited when erasing data.

Accordingly, the present invention aims to propose a fabrication method used to fabricate a poly spacer and devices like flash memory cells so as to resolve the drawbacks in the prior art.

SUMMARY OF THE INVENTION

The primary object of the present invention is to propose a fabrication method of devices like flash memory cells, which is used to fabricate a poly spacer and use the poly spacer as a floating gate so as to obtain a channel length of stability and easy control and tips useful for point discharge. Repetitive control of fabrication of semiconductor devices can thus be achieved.

Another object of the present invention is to propose a method for fabricating semiconductor devices having good profiles.

To achieve the above objects, an oxide and a predefined and patterned first dielectric are formed on the surface of a semiconductor substrate. A first poly silicon and a second dielectric are then formed in order on the surfaces of the oxide and the first dielectric. Next, anisotropic etch is performed to the second dielectric to form dielectric spacer around the first poly silicon. The first poly silicon is then etched with the dielectric spacer as a mask. To form poly spacer around the first dielectric. Finally, the first dielectric is removed. A poly spacer structure is thus completed.

Ion doped regions used as a source and a drain are formed in the semiconductor substrate by using the above poly spacer already formed on the semiconductor substrate. An insulating dielectric and a control gate are formed in order on the semiconductor substrate. A flash memory structure using the poly spacer as a floating gate is thus formed.

The various objects and advantages of the present invention will be more readily understood from the following detailed description when read in conjunction with the appended drawings, in which:

DETAILED DESCRIPTION OF THE PREFERRED EMBODIMENTS

The present invention discloses a fabrication method of devices like flash memory cells, which is used to fabricate a poly spacer as a floating gate by means of dual-spacer process so as to fabricate a channel length of stability and easy control and tips useful for point discharge. Repetitive control of fabrication of semiconductor devices can thus be achieved.

Figure 1A:
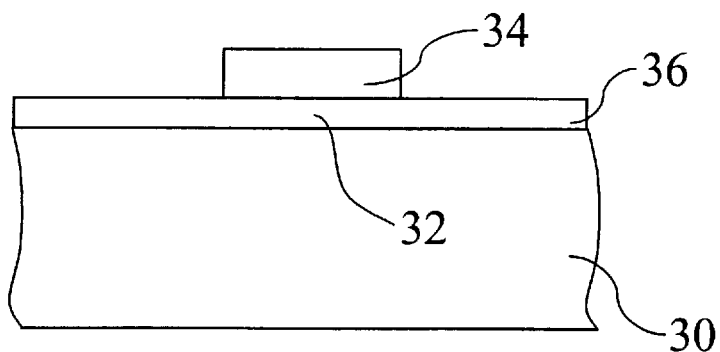
FIGS. 1(a) to 1(d) are diagrams showing the fabrication process of a flash memory using the poly spacer as a floating gate in the prior art.
Figure 1B:
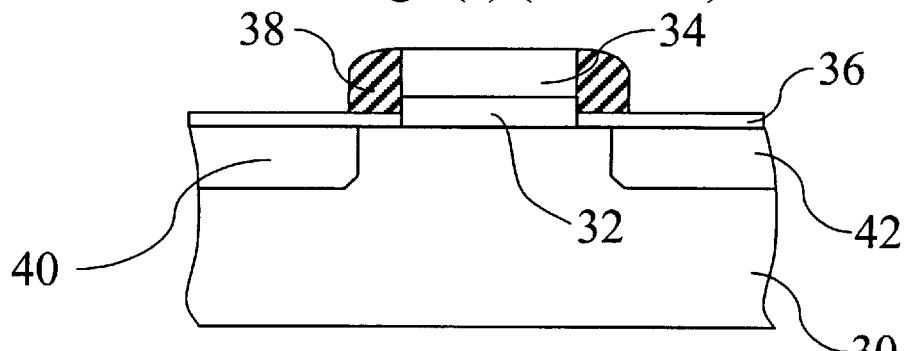
Figure 1C:
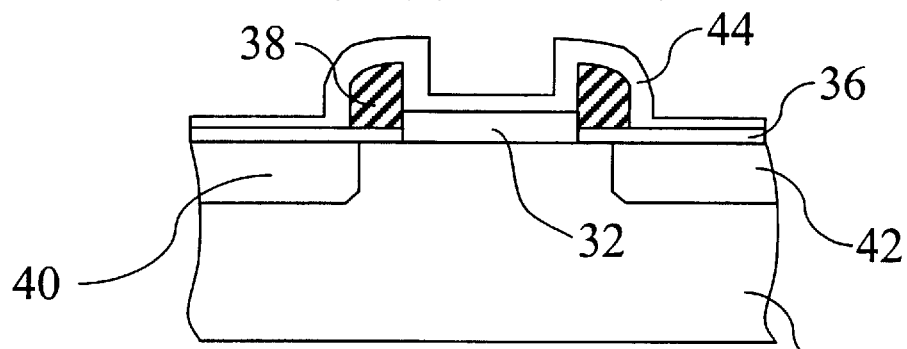
Figure 1D:
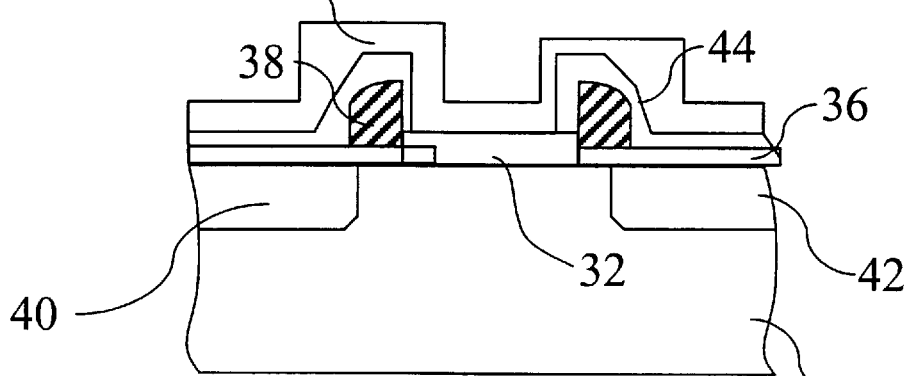
Figure 2A:
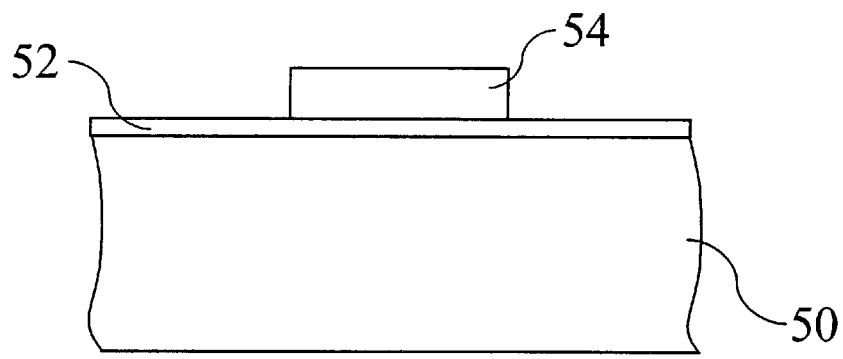
FIGS. 2(a) to 2(e) are cross-sectional diagrams showing the fabrication steps of the poly spacer of the present invention.

FIGS. 2(a) to 2(e) are cross-sectional diagrams showing the fabrication steps of a poly spacer according to a preferred embodiment of the present invention. First, as shown in FIG. 2(a), an oxide 52 is deposited on the surface of a semiconductor silicon substrate 50. A predefined and patterned first dielectric 54 is formed on the surface of the oxide 52 with a patterned photo resist as a mask by means of photolithography.

Figure 2B:
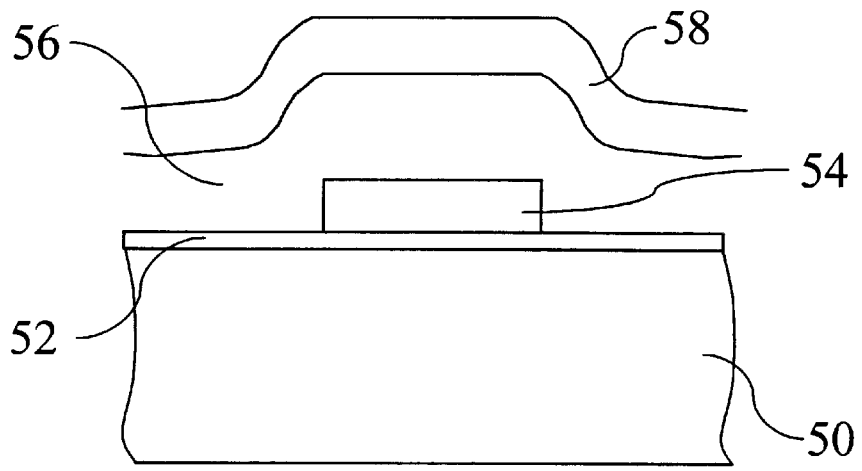
Figure 2C:
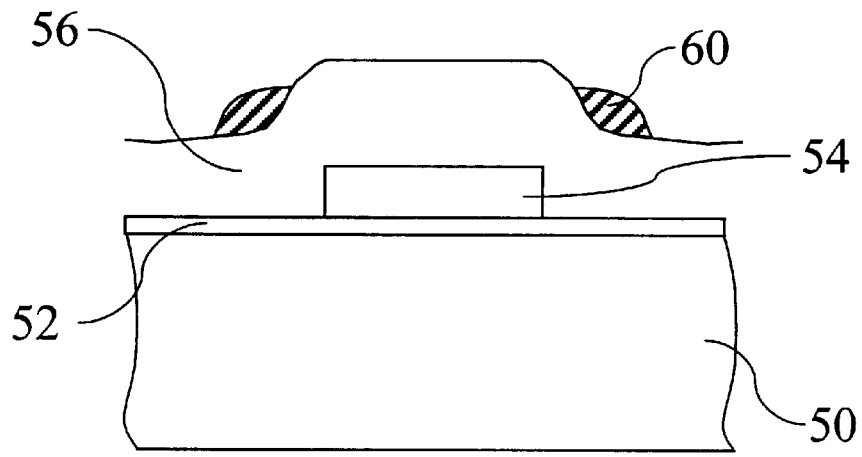
Figure 2D:
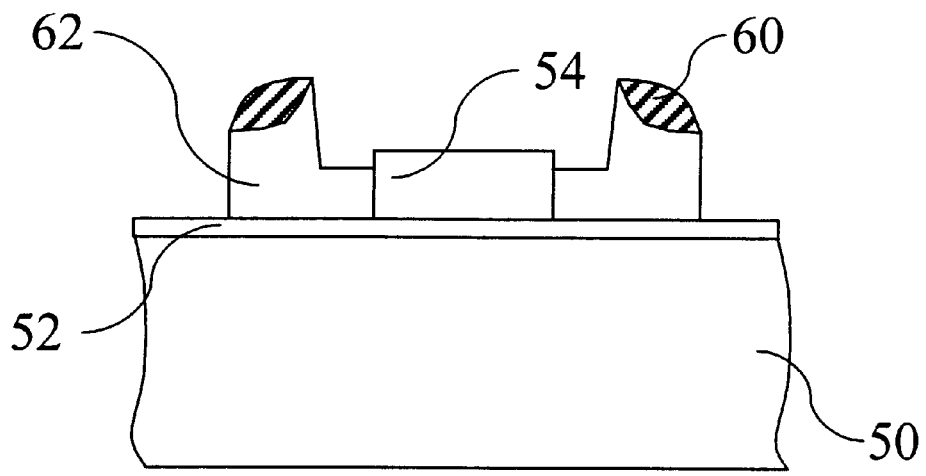
Figure 2E:
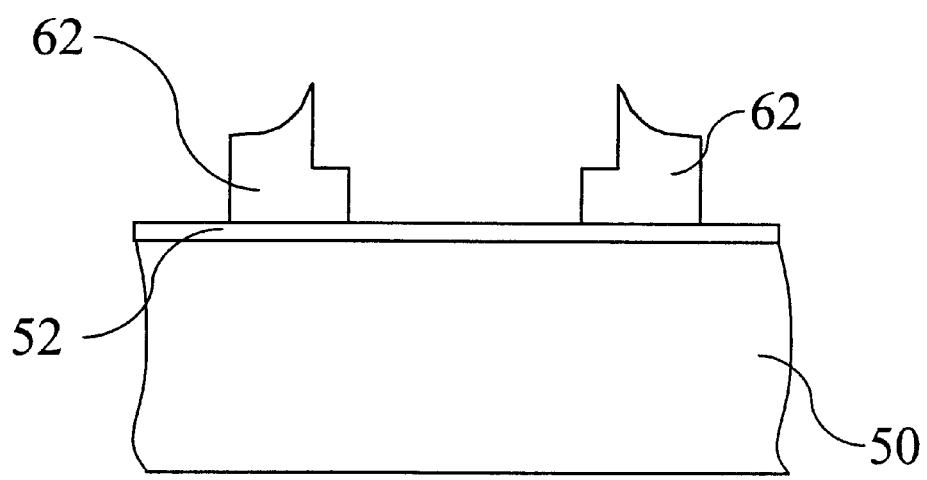

Next, as shown in FIG. 2(b), a first poly silicon 56 and a second dielectric 58 are deposited in order on the semiconductor substrate 50 to cover the exposed surfaces of the oxide 52 and the first dielectric 54. Referring to FIG. 2(c), anisotropic etch is performed to the second dielectric 58. Because the first poly silicon covering the first dielectric 54 has a slightly projective region, most of the second dielectric 58 will be removed with only the part of poly silicon around the projective region of the first poly silicon 56 remained when performing etch, hence forming dielectric spacer 60.

The first poly silicon 56 is then etched with the dielectric spacer 60 as a mask by means of anisotropic etch, thereby forming poly spacer 62 around the first dielectric 54, as shown in FIG. 2(*d*). Finally, the dielectric spacer 60 and the first dielectric 54 are removed, as shown in FIG. 2(*e*). A poly spacer structure 62 having dual tips at the top thereof is thus formed.

The above first dielectric 54 and the second dielectric 58 can be composed of identical or different material. The material of the first dielectric 54 or the second dielectric 58 can be selected among the group composed of oxide, nitride, their combination, or other similar dielectrics.

Figure 3A:
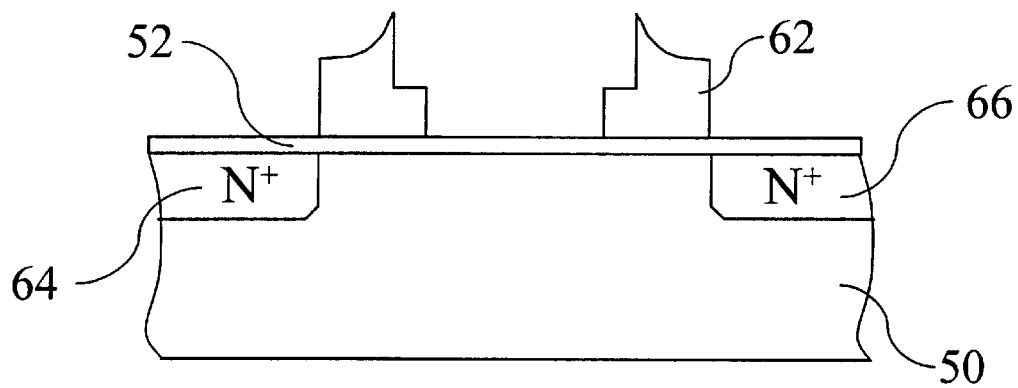
FIGS. 3(a) to 3(c) are cross-sectional diagrams showing the fabrication steps of a flash memory of the present invention.
Figure 3B:
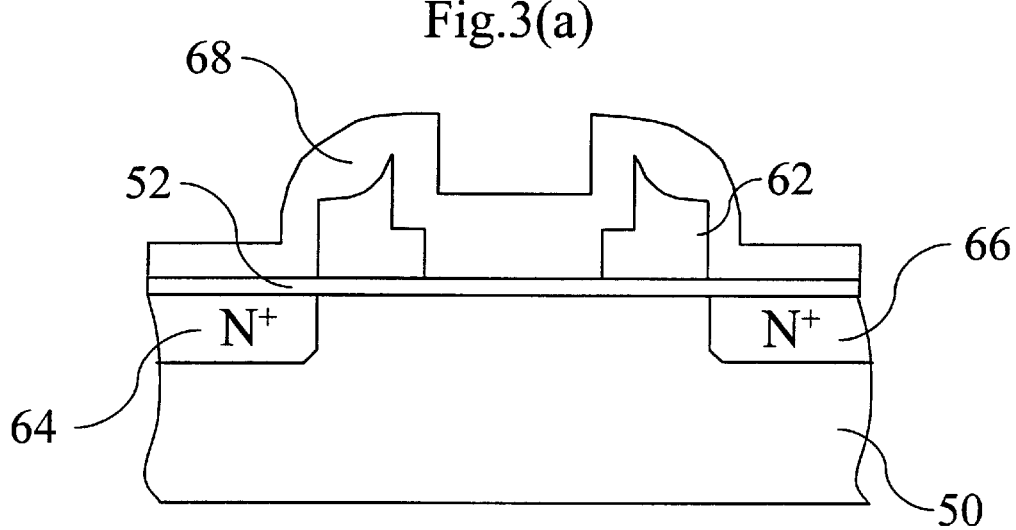
Figure 3C:
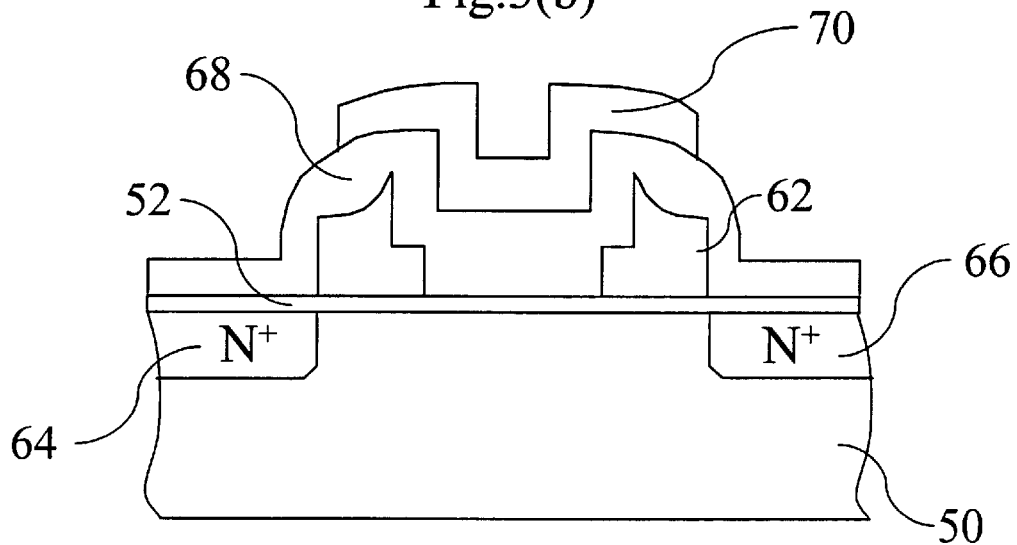

The forepart of the fabrication method of flash memory of the present invention is the same as that in the prior art and thus will not be further described. The fabrication process after the spacer is finished will be illustrated below. FIGS. 3(*a*) to 3(*c*) are cross-sectional diagrams showing the later fabrication steps of a flash memory according to a preferred embodiment of the present invention.

First, the poly spacer structure 62 having dual tips at the top thereof is already formed on the semiconductor substrate 50. The poly spacer structure 62 is used as a floating gate. Ion implantation is then performed to the exposed semiconductor substrate 50 to form two n-type doped regions respectively used as a source 64 and a drain 66, as shown in FIG. 3(*a*).

Referring to FIG. 3(*b*), an insulating dielectric 68 is deposited on the semiconductor substrate 50 to cover the poly spacer 62 and the oxide 52. The insulating dielectric 68 is dielectric like oxide-nitride-oxide (ONO) or oxide-nitride (ON). If the above dielectric spacer 60 is not removed, it can also be compatible with the ONO or ON film, and the insulating dielectric 68 directly covers on the surface of the dielectric spacer 60.

Next, as shown in FIG. 3(*c*), a second poly silicon 70 is formed on the surface of the insulating dielectric 68. The pattern of the second poly silicon 70 is defined to form a control gate 70 with a patterned photo resist as a mask by means of photolithography. A flash memory cell structure is thus obtained. Finally, subsequent steps of forming the contact window or metal layer can be performed in the conventional way.

In the above steps of the present invention, the ONO or ON film having good dielectric characteristic is used as the insulating dielectric 68 so that better dielectric characteristic and control of thickness can be achieved. Besides, the material of the insulating dielectric 68 can be composed of oxide, nitride, their combination, or other dielectrics.

Although the size of the dielectric spacer 60 fabricated by the present invention may be uncertain, but the ends of the two outer sides of the poly spacer 62 are fixed (one end of the poly spacer 62 abuts against the edge of the first dielectric 54, and the other end thereof is the point where the second dielectric 58 becomes flat), the length of the poly spacer 62 defined by the dielectric spacer 60 can be controllably fixed. Therefore, a channel length of stability and easy control can be fabricated. Moreover, because the poly spacer 62 has a very good profile and a very vertical sidewall structure, the implanted positions of ions can be easily controlled, hence reducing the difficulty of controlling the channel. When being used for point discharge of Fowler-Nordheim tunneling, because the dual-tip structure at the top of the poly spacer 62 has a very sharp tip, the concentration effect of electric field is good, and the effect of point discharge is good accordingly. Therefore, repetitive control of fabrication can be achieved for the poly spacer and flash memory fabricated by the method of the present invention.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A fabrication method of poly spacer, comprising the steps of:

providing a semiconductor substrate and depositing an oxide on a surface of said substrate;

forming a predefined and patterned first dielectric on a surface of said oxide;

depositing a poly silicon on said substrate to cover said oxide and said first dielectric;

depositing a second dielectric on a surface of said poly silicon;

performing anisotropic etch to said second dielectric and forming dielectric spacer around projective sides of said poly silicon;

performing etch to said poly silicon with said dielectric spacer as a mask to form poly spacer around said first dielectric; and removing said first dielectric.

2. The fabrication method as claimed in claim 1, wherein said first dielectric and said second dielectric are composed of the same material.

3. The fabrication method as claimed in claim 1, wherein said first dielectric is composed of oxide, nitride, their combination, or other dielectrics.

4. The fabrication method as claimed in claim 1, wherein said second dielectric is composed of oxide, nitride, their combination, or other dielectrics.

5. The fabrication method as claimed in claim 1, wherein said predefined and patterned first dielectric is formed with a patterned photo resist as a mask.

6. The fabrication method as claimed in claim 1, wherein the step of etching said poly silicon is accomplished by anisotropic etch.

7. The fabrication method as claimed in claim 1, wherein said dielectric spacer can be simultaneously removed when removing said first dielectric.

8. A fabrication method of flash memory utilizing poly spacer as floating gate, comprising the steps of:

providing a semiconductor substrate and depositing an oxide on a surface of said substrate;

forming a predefined and patterned first dielectric on a surface of said oxide;

depositing a first poly silicon on said substrate to cover said oxide and said first dielectric;

depositing a second dielectric on a surface of said poly silicon;

performing anisotropic etch to said second dielectric and forming dielectric spacer around projective sides of said first poly silicon;

performing etch to said first poly silicon with said dielectric spacer as a mask to form poly spacer around said first dielectric, then removing said first dielectric;

performing ion implantation to said substrate to form ion doped regions;

depositing an insulating dielectric on said substrate to cover said poly spacer and said oxide; and forming a predefined second poly silicon on said insulating dielectric as a control gate.

9. The fabrication method as claimed in claim 8, wherein said first dielectric and said second dielectric are composed of the same material.

10. The fabrication method as claimed in claim 8, wherein said first dielectric is composed of oxide, nitride, their combination, or other dielectrics.

11. The fabrication method as claimed in claim 8, wherein said second dielectric is composed of oxide, nitride, their combination, or other dielectrics.

12. The fabrication method as claimed in claim 8, wherein said predefined and patterned first dielectric is formed with a patterned photo resist as a mask.

13. The fabrication method as claimed in claim 8, wherein said insulating dielectric is a dielectric structure comprising oxide-nitride-oxide.

14. The fabrication method as claimed in claim 8, wherein said insulating dielectric is a dielectric structure comprising nitride-oxide.

15. The fabrication method as claimed in claim 8, wherein said insulating dielectric is composed of oxide, nitride, their combination, or other dielectrics.

16. The fabrication method as claimed in claim 8, wherein the step of etching said poly silicon is accomplished by anisotropic etch.

17. The fabrication method as claimed in claim 8, wherein said predefined second poly silicon is formed with a patterned photo resist as a mask.

18. The fabrication method as claimed in claim 8, wherein said ion doped regions are n-type doped regions.

19. The fabrication method as claimed in claim 8, wherein said dielectric spacer can be simultaneously removed when removing said first dielectric.

* * * * *